(12) United States Patent
Yu et al.

(10) Patent No.: US 7,670,902 B2
(45) Date of Patent: Mar. 2, 2010

(54) METHOD AND STRUCTURE FOR LANDING POLYSILICON CONTACT

(75) Inventors: Chris C. Yu, Shanghai (CN); Hongxiu Peng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 395 days.

(21) Appl. No.: 11/190,392

(22) Filed: Jul. 26, 2005

(65) Prior Publication Data

US 2007/0026656 A1    Feb. 1, 2007

(51) Int. Cl.
    *H01L 21/20* (2006.01)
(52) U.S. Cl. .................... 438/244; 438/288; 438/592; 438/595; 438/631; 438/636; 257/E21.252; 257/E21.268; 257/E21.577; 257/E21.653; 257/E23.019
(58) Field of Classification Search ............ 438/230, 438/197, 199, 168, 437, 913, 744, 156, 653.1, 438/595–597, 724, 633, 34, 638, 400, 424, 438/586, 587, 672, 691–693; 257/E29.027, 257/E21.177, E21.019, 68, 304, 614, E27.026, 257/81, 88
See application file for complete search history.

(56) References Cited

U.S. PATENT DOCUMENTS

| | | | |
|---|---|---|---|
| 5,700,706 A | 12/1997 | Juengling | |
| 5,936,272 A * | 8/1999 | Lee | 257/306 |
| 6,010,955 A * | 1/2000 | Hashimoto | 438/597 |
| 6,162,368 A * | 12/2000 | Li et al. | 216/89 |
| 6,200,875 B1 | 3/2001 | Jang et al. | |
| 6,218,286 B1 * | 4/2001 | Su et al. | 438/624 |
| 6,387,759 B1 * | 5/2002 | Park et al. | 438/275 |
| 6,420,269 B2 * | 7/2002 | Matsuzawa et al. | 438/693 |
| 6,423,641 B1 * | 7/2002 | Gau | 438/692 |
| 6,524,906 B2 | 2/2003 | Jang | |
| 6,723,655 B2 * | 4/2004 | Park et al. | 438/742 |
| 6,784,084 B2 * | 8/2004 | Kang et al. | 438/586 |
| 6,849,497 B2 * | 2/2005 | Hashimoto | 438/244 |
| 6,867,450 B2 * | 3/2005 | Kito et al. | 257/301 |
| 6,902,998 B2 * | 6/2005 | Lee et al. | 438/616 |
| 6,936,885 B2 * | 8/2005 | Shin et al. | 257/315 |
| 6,953,970 B2 * | 10/2005 | Yuan et al. | 257/350 |
| 6,960,523 B2 * | 11/2005 | Maldei et al. | 438/639 |
| 7,029,509 B2 * | 4/2006 | Kim et al. | 51/308 |
| 7,037,838 B2 * | 5/2006 | Schowalter et al. | 438/690 |
| 7,153,744 B2 * | 12/2006 | Chen et al. | 438/267 |
| 7,172,970 B2 * | 2/2007 | Lin et al. | 438/692 |

(Continued)

*Primary Examiner*—Michael S Lenbentritt
(74) *Attorney, Agent, or Firm*—Townsend and Townsend and Crew LLP

(57) ABSTRACT

A method for fabricating an integrated circuit device. A plurality of MOS transistor devices are formed overlying a semiconductor substrate. Each of the MOS transistor devices includes a nitride cap and nitride sidewall spacers. An interlayer dielectric layer is formed overlying the plurality of MOS transistor devices. A portion of the interlayer dielectric material is removed to expose at least portions of three MOS transistor devices and expose at least three regions between respective MOS transistor devices. The method deposits polysilicon fill material overlying the exposed three regions and overlying the three MOS transistor devices. The method performs a chemical mechanical planarization process on the polysilicon material to reduce a thickness of the polysilicon material exposing a portion of the interlayer dielectric material until the cap nitride layer on each of the MOS transistors has been exposed using the cap nitride layer as a polish stop layer.

20 Claims, 6 Drawing Sheets

U.S. PATENT DOCUMENTS

| | | | |
|---|---|---|---|
| 7,333,370 B2* | 2/2008 | Tran | 365/189.011 |
| 7,382,054 B2* | 6/2008 | Luoh et al. | 257/774 |
| 2002/0090837 A1* | 7/2002 | Chung et al. | 438/980 |
| 2003/0003718 A1* | 1/2003 | Park et al. | 438/638 |
| 2004/0123528 A1* | 7/2004 | Jung et al. | 51/309 |

* cited by examiner

METHOD AND STRUCTURE FOR LANDING POLYSILICON CONTACT

BACKGROUND OF THE INVENTION

The present invention is directed integrated circuits and their processing for the manufacture of semiconductor devices. More particularly, the invention provides a method and system for chemical mechanical polishing landing pad structures in dynamic random access memory ("DRAM") integrated circuit devices. But it would be recognized that the invention has a much broader range of applicability. For example, the invention can be applied to a variety of other applications such as application specific integrated circuits, microprocessors, microcontrollers, other memory applications, and the like.

Over the past decades, integrated circuits have evolved from a handful of interconnected devices fabricated on a single chip of silicon to millions of devices. Performance and complexity are far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Certain semiconductor devices are now being fabricated with features less than a quarter of a micron across.

Increasing circuit density has not only improved the complexity and performance of circuits but also provided lower costs to consumers. Conventional semiconductor fabrication plants often costs hundreds of millions or even billions of U.S. dollars to construct. Each fabrication facility has a certain capacity measured in tens of thousands of wafer starts per month. Each wafer also has a certain number of potential chips. By manufacturing individual devices smaller and smaller, more devices are packed in a given area of semiconductor, which increases output of the fabrication facility. Making devices smaller is always very challenging, as each process for the manufacture of semiconductor devices has a limit. That is to say, a given process typically only works down to a certain feature size, and then either the process or the device layout should be changed.

Costs of operating fabrication facilities have also increased dramatically. As many know, many U.S. fabrication facilities that were operable in the 1970's and 1980's no longer exist. Many of such fabrication facilities migrated to Japan in the 1980's and then to Korea and Taiwan in the 1990's. As demand for lower cost fabrication facilities continues, China has now become a choice geographic location for fabrication facilities to start up. Many companies have announced plans to begin manufacturing facilities in China. Such companies include, but are not limited to, Motorola, Inc., Taiwan Semiconductor Manufacturing Corporation of Taiwan, also called TSMC, and others. Although labor costs may be somewhat lower in China, there are still many costs that still need to be reduced or even eliminated as the demand for lower cost silicon continues.

From the above, it is seen that an improved technique for processing semiconductor devices is desired.

BRIEF SUMMARY OF THE INVENTION

According to the present invention, techniques for the manufacture of semiconductor devices are provided. More particularly, the invention provides a method and system for chemical mechanical polishing landed polysilicon contact structures in dynamic random access memory integrated circuit devices. Here, the term "landed" or "landing" refer to similar structures according to one of ordinary skill in the art. But it would be recognized that the invention has a much broader range of applicability. For example, the invention can be applied to a variety of other applications such as application specific integrated circuits, microprocessors, microcontrollers, other memory applications, and the like. In a specific embodiment, the present invention provides a method of chemical mechanical polishing for forming landed polysilicon contact. The chemical mechanical polishing uses an oxide slurry rather than conventional polysilicon slurry in a specific embodiment. Preferably, an adequate gate silicon nitride critical dimension is obtained by chemical mechanical polishing using the oxide slurry according to the present invention. Preferably, the present method achieves lower cost, good material selectivities, reduced dishing, less erosion, and provides higher throughput, among other benefits.

Preferably, the present invention provides a method that is compatible to polish three different films at the same time and also obtains an adequate gate silicon nitride critical dimension. We have discovered that conventional polysilicon slurry has high selectivity between polysilicon and borophosphosilicate glass commonly called "BPSG", which makes such conventional process undesirable.

According to the present invention, three different materials such as polysilicon, BPSG, and silicon nitride are polished using an oxide slurry according to the present invention. Examples of conventional techniques do not polish using an oxide slurry according to the present invention. See, for example U.S. Pat. Nos. 5,700,706, 6,200,875, and 6,524,906.

In a specific embodiment, the present invention provides a method for fabricating an integrated circuit device, e.g., DRAM. The method includes providing a semiconductor substrate, e.g., silicon wafer. The method includes forming a plurality of MOS transistor devices overlying the semiconductor substrate. Each of the MOS transistor devices has a nitride cap and nitride sidewall spacers. Each of the transistors is separated from each other by a predetermined width, e.g., 0.1 um. The method includes forming an interlayer dielectric layer (e.g., BPSG) overlying the plurality of MOS transistor devices and removing a portion of the interlayer dielectric material to expose at least portions of three MOS transistor devices and expose at least three regions (e.g., substrate surface) between respective MOS transistor devices. Preferably, the three regions correspond to active regions of the MOS transistor devices. The method deposits polysilicon fill material overlying the exposed three regions to form electrical contacts and overlying the three MOS transistor devices. Next, the method performs a chemical mechanical planarization process on the polysilicon material to reduce a thickness of the polysilicon material to expose a portion of the interlayer dielectric material. The method continues the chemical mechanical planarization process to remove the interlayer dielectric material and the polysilicon film material until the cap nitride layer on each of the MOS transistors has been exposed. The method uses the cap nitride layer overlying each of the MOS transistors as a polish stop layer.

In an alternative specific embodiment, the invention provides a method for fabricating an integrated circuit device, e.g., DRAM. The method includes providing a semiconductor substrate and forming a plurality of MOS transistor devices overlying the semiconductor substrate. Each of the MOS transistor devices has a nitride cap and nitride sidewall spacers. Each of the transistors is separated from each other by a predetermined width. The method forms an interlayer dielectric layer overlying the plurality of MOS transistor devices and removes a portion of the interlayer dielectric material to expose at least portions of three MOS transistor devices and expose at least three regions between respective MOS transistor devices. The method includes depositing polysilicon fill material overlying the exposed three regions and overlying the three MOS transistor devices and using an oxide slurry mixture, performing a chemical mechanical planarization process on the polysilicon material to reduce a thickness of the polysilicon material to expose a portion of the interlayer dielectric material. The method continues the chemical mechanical planarization process to remove the interlayer dielectric material and the polysilicon film material until the cap nitride layer on each of the MOS transistors has been exposed. The method uses the cap nitride layer overlying each of the MOS transistors as a polish stop layer.

In a specific embodiment, the present invention provides a method for fabricating an integrated circuit device, e.g., DRAM. The method includes providing a semiconductor substrate, e.g., silicon wafer. The method includes forming a plurality of MOS transistor devices overlying the semiconductor substrate. Preferably, the method includes forming an interlayer dielectric layer overlying the plurality of MOS transistor devices and removing a portion of the interlayer dielectric material to expose at least portions of three MOS transistor devices and expose at least three regions between respective MOS transistor devices. The method includes depositing polysilicon fill material overlying the exposed three regions and overlying the three MOS transistor devices. Next, the method uses an oxide slurry mixture to perform a chemical mechanical planarization process on the polysilicon material to reduce a thickness of the polysilicon fill material to expose a portion of the interlayer dielectric material. The method continues the chemical mechanical planarization process and simultaneously removes the interlayer dielectric material and the polysilicon fill material using the oxide slurry mixture while performing the chemical mechanical planarization process until the cap nitride layer on each of the MOS transistors has been exposed. The method uses the cap nitride layer overlying each of the MOS transistors as a polish stop layer.

Many benefits are achieved by way of the present invention over conventional techniques. For example, the present technique provides an easy way to use process that relies upon conventional technology. In some embodiments, the method provides higher device yields in dies per wafer. Additionally, the method provides a process that is compatible with conventional process technology without substantial modifications to conventional equipment and processes. Another aspect of the invention provides a landed polysilicon contact chemical mechanical polishing process using oxide slurry to obtain lower cost, an adequate gate silicon nitride critical dimension, improved uniformity, lower dishing and erosion of the landed polysilicon and BPSG. In yet another embodiment, the invention provides a process including an etch back process, which performs etch back first, after depositing polysilicon, and then performing chemical mechanical polishing. Still further, the invention provides a direct chemical mechanical polishing process, which performs landed polysilicon contact chemical mechanical polishing after depositing polysilicon. Preferably, the invention provides a process, which has the same or similar removal rate of polysilicon and BPSG, and a lower removal rate of silicon nitride using a certain dilution of oxide slurry. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for manufacturing semiconductor devices are provided. More particularly, the invention provides a method and system for chemical mechanical polishing of landed polysilicon contacts in dynamic random access memory integrated circuit devices. But it would be recognized that the invention has a much broader range of applicability. For example, the invention can be applied to a variety of other applications such as application specific integrated circuits, microprocessors, microcontrollers, other memory applications, and the like.

A CMP method according to an embodiment of the present invention may be outlined as follows.

1. Provide a semiconductor substrate, e.g., silicon wafer;

2. Form a plurality of MOS transistor devices (each having gate oxide, a nitride cap and nitride spacers and source/drain regions) overlying the semiconductor substrate;

3. Form an interlayer dielectric layer (e.g., BPSG) overlying the plurality of MOS transistor devices;

4. Removes a portion of the interlayer dielectric material to expose at least portions (e.g., gate structures) of three MOS transistor devices and expose at least three regions (e.g., source/drain regions) between respective MOS transistor devices;

5. Deposit polysilicon fill material overlying the exposed three regions for electrical contact and overlying the three MOS transistor devices;

6. Use an oxide slurry mixture, to perform a chemical mechanical planarization process on the polysilicon material to reduce a thickness of the polysilicon material to expose a portion of the interlayer dielectric material;

7. Continue the chemical mechanical planarization process to remove the interlayer dielectric material and the polysilicon film material until the cap nitride layer on each of the MOS transistors has been exposed while using the cap nitride layer overlying each of the MOS transistors as a polish stop layer; and 8. Perform other steps, as desired.

The above sequence of steps provides a method for CMP a landed polysilicon contacts according to an embodiment of the present invention. As shown, the method uses a combination of steps including a way of CMP that uses an oxide slurry for polishing a landed polysilicon contacts. Other alternatives can also be provided where steps are added, one or more steps are removed, or one or more steps are provided in a different sequence without departing from the scope of the claims herein. Further details of the present method can be found throughout the present specification and more particularly below.

Figure 1:
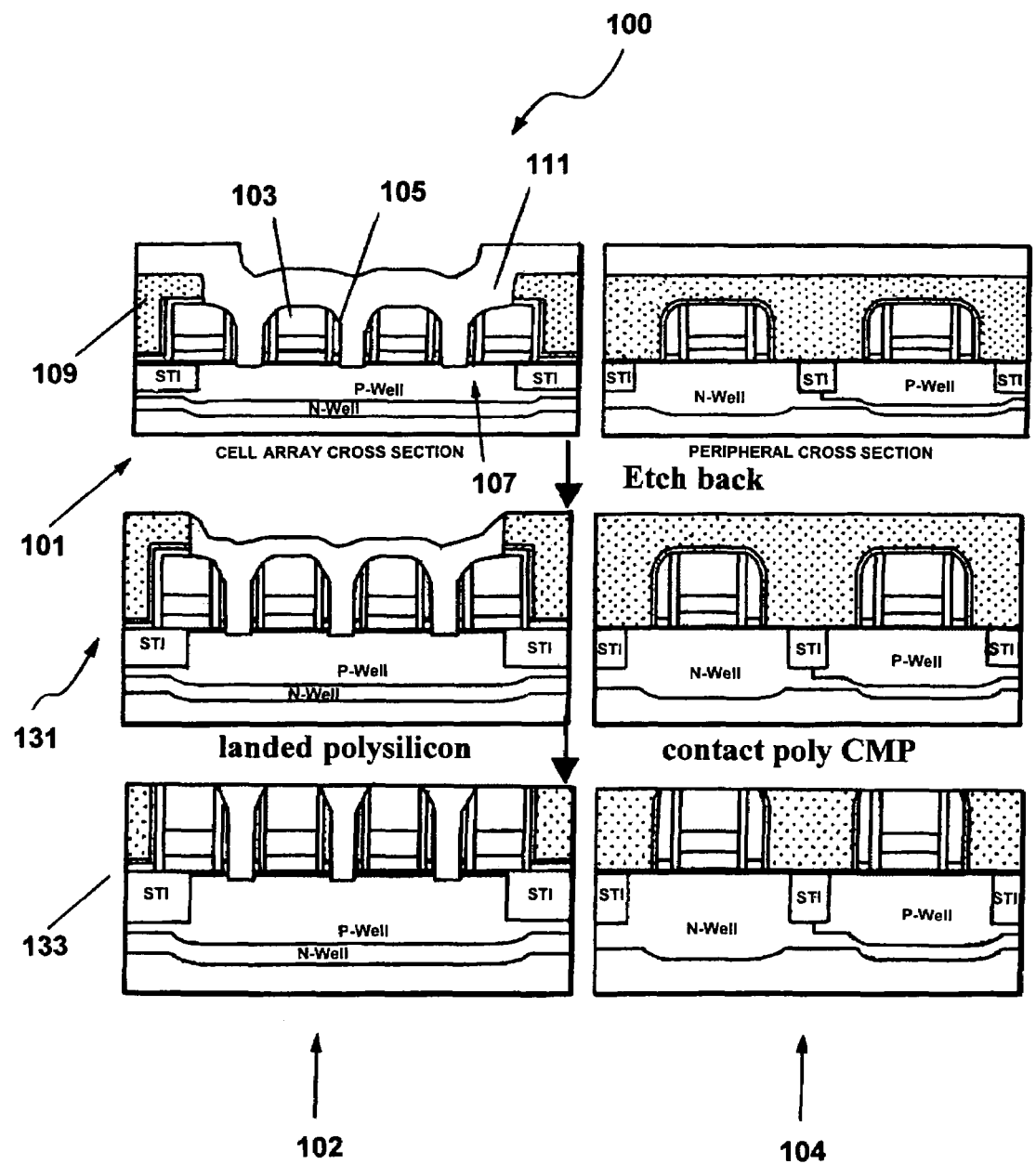
FIG. 1 is simplified illustration of an etch back process according to an embodiment of the present invention.

FIG. 1 is simplified illustration of an etch back process according to an embodiment of the present invention. This diagram is merely an example, which should not unduly limit the scope of the claims herein. One of ordinary skill in the art would recognize many variations, modifications, and alternatives. As shown, the present invention includes a method for fabricating an integrated circuit device, e.g., DRAM. As also shown, the method illustrates transistors in peripheral 104 and cell regions 102. The peripheral region can include logic circuitry. The cell region includes memory cells or the like. The memory cells can be dynamic random access memory cells, and the others. Of course, one of ordinary skill in the art would recognize other variations, modifications, and alternatives.

The method includes providing a semiconductor substrate 100, e.g., silicon wafer. The method includes forming a plurality of MOS transistor devices 101 overlying the semiconductor substrate. Each of the MOS transistor devices has a nitride cap 103 and nitride sidewall spacers 105. Each of the devices also includes gate region coupled to source/drain regions. Each of the transistors is separated from each other by a predetermined width 107, e.g., 0.1 um. The source/drain regions separate each of the gate regions.

Preferably, the method includes forming an interlayer dielectric layer 109 overlying the plurality of MOS transistor devices. Preferably, the interlayer dielectric is a doped glass layer, such as BPSG, FSG, and others. The method includes removing a portion of the interlayer dielectric material to expose at least portions of three MOS transistor devices and expose at least three regions between respective MOS transistor devices. The three exposed regions are source/drain regions for the MOS transistor devices.

Next, the method deposits polysilicon fill material 111 overlying the exposed three regions and overlying the three MOS transistor devices. Preferably, the polysilicon fill material can be doped polysilicon material, such as in-situ doped polysilicon material. The material can be deposited in an amorphous or polysilicon state, depending upon the application. If deposited in the amorphous state, it is later crystallized into the polysilicon state. The dopant can be phosphorous having a concentration ranging from about $1.4E^{20}$ cm$^{-3}$ to about $1.4E^{21}$ cm$^{-3}$, depending upon the application. Preferably, the polysilicon fill material forms good electrical contact with the exposed source/drain regions and is in direct contact with such exposed source/drain regions.

Optionally, the method performs an etchback process 131, as shown. The etchback process can use any suitable etching process, such as dry or wet or a combination of these. A reactive ion etch(RIE) process is used. Preferably, etchback may occur while the peripheral portion of the structure has been protected using a masking layer. Etchback occurs using a selective etching process that removes polysilicon and maintains the interlayer dielectric layer. Of course, one of ordinary skill in the art would recognize other variations, modifications, and alternatives.

Next, the method performs a chemical mechanical planarization process 133 on the polysilicon material to reduce a thickness of the polysilicon material to expose a portion of the interlayer dielectric material. The method continues the chemical mechanical planarization process to remove the interlayer dielectric material and the polysilicon film material until the cap nitride layer on each of the MOS transistors has been exposed. Preferably, the polysilicon fill material and the interlayer dielectric material are simultaneously removed. The method uses the cap nitride layer overlying each of the MOS transistors as a polish stop layer.

Preferably, the method uses an oxide slurry mixture to remove the fill material and interlayer dielectric layer simultaneously. The oxide slurry mixture also provides selectivity between the polysilicon fill material and interlayer dielectric material to the cap nitride layer and nitride spacers. In a specific embodiment, the oxide slurry mixture can be diluted in water. As merely an example, the oxide slurry can be SS-25 manufactured by Cabot Microelectronics Corporation of 870 Commons Drive, Aurora, Ill. 60564, but can be others. SS-25 can be diluted by 10:1 to 2:1(water to SS-25 ratio) in certain embodiments. Of course, there can be other variations, modifications, and alternatives.

Figure 2:
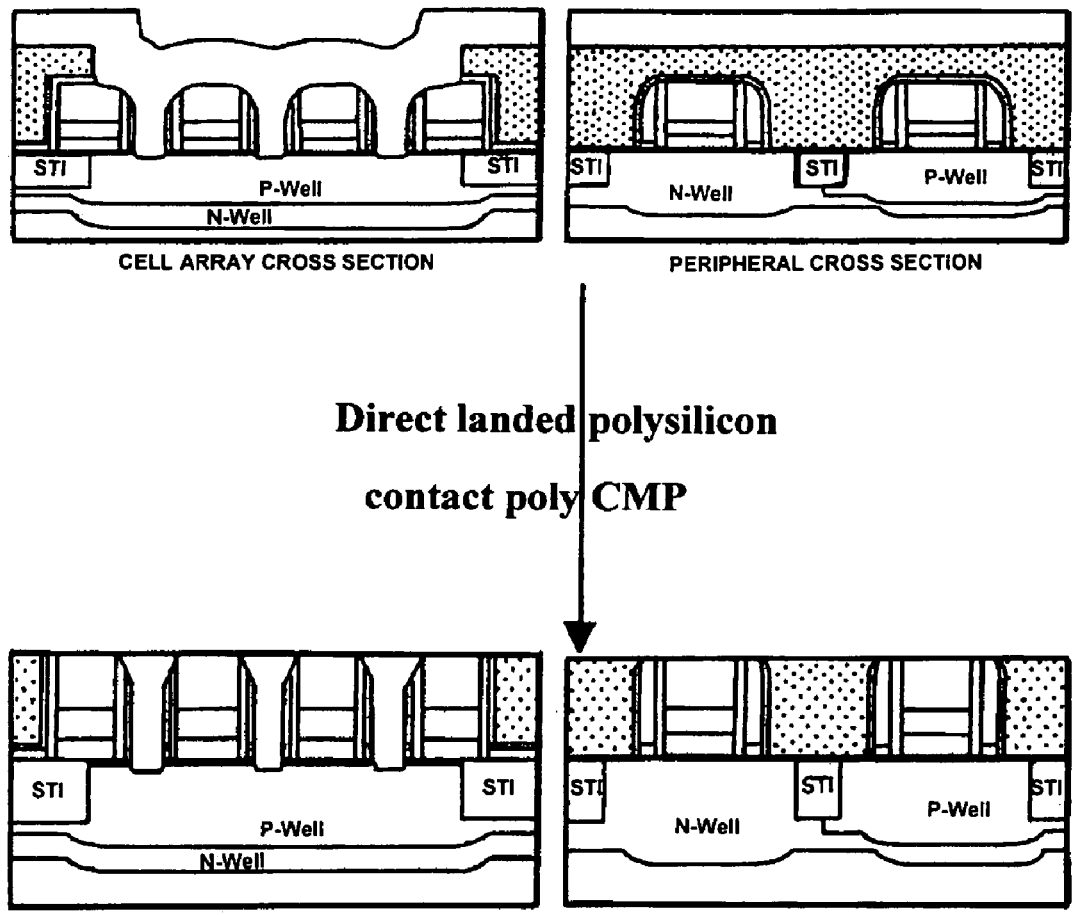
FIG. 2 is a simplified illustration of a direct landed polysilicon contact chemical mechanical polishing process according to an embodiment of the present invention.

FIG. 2 is a simplified direct landed polysilicon contact chemical mechanical polishing process according to an embodiment of the present invention. This diagram is merely an example, which should not unduly limit the scope of the claims herein. One of ordinary skill in the art would recognize many variations, modifications, and alternatives. As shown, the present invention includes a method for fabricating an integrated circuit device, e.g., DRAM. As also shown, the method illustrates transistors in peripheral and cell regions. The peripheral region can include logic circuitry. The cell region includes memory cells or the like. The memory cells can be dynamic random access memory cells, and the others. Of course, one of ordinary skill in the art would recognize other variations, modifications, and alternatives.

The method includes providing a semiconductor substrate, e.g., silicon wafer. The method includes forming a plurality of MOS transistor devices overlying the semiconductor substrate. Each of the MOS transistor devices has a nitride cap and nitride sidewall spacers. Each of the transistors is separated from each other by a predetermined width, e.g., 0.1 um.

Preferably, the method includes forming an interlayer dielectric layer overlying the plurality of MOS transistor devices. Preferably, the interlayer dielectric is a doped glass layer, such as BPSG, FSG, and others. The method includes removing a portion of the interlayer dielectric material to expose at least portions of three MOS transistor devices and expose at least three regions between respective MOS transistor devices. At least three regions between transistors are exposed from the interlayer dielectric. At least four portions of transistors are exposed from the interlayer dielectric.

Next, the method deposits polysilicon fill material overlying the exposed three regions and overlying the three MOS transistor devices. Preferably, the polysilicon fill material can be doped polysilicon material, such as in-situ doped polysilicon material. The material can be deposited in an amorphous or polysilicon state, depending upon the application. If deposited in the amorphous state, it is later crystallized into the polysilicon state. The dopant can be phosphorous having a concentration ranging from about $1.4E^{20}$ cm$^{-3}$ to about $1.4E^{21}$ cm$^{-3}$, depending upon the application.

Next, the method performs a chemical mechanical planarization process on the polysilicon material to reduce a thickness of the polysilicon material to expose a portion of the interlayer dielectric material. The method continues the chemical mechanical planarization process to remove the interlayer dielectric material and the polysilicon film material until the cap nitride layer on each of the MOS transistors has been exposed. Preferably, the polysilicon fill material and the interlayer dielectric material are simultaneously removed. The method uses the cap nitride layer overlying each of the MOS transistors as a polish stop layer. Of course, there can be other variations, modifications, and alternatives.

In a specific embodiment, the present invention provides a method of simultaneously polishing polysilicon, BPSG, and silicon nitride using oxide slurry and stopping at a gate silicon nitride. After the gate is formed and BPSG is finished using CMP, the landed polysilicon contact pattern is formed by landed polysilicon contact photolithography and etching. Doped polysilicon is deposited above BPSG and the landed contact. Using an etch back process, the doped polysilicon layer is etched until the BPSG film is exposed. The BPSG layer and landed polysilicon are polished together to stop at the gate silicon nitride. The method includes an over-polishing time to remove some landed polysilicon contact pattern on the silicon nitride to touch polish the silicon nitride. Preferably, a little silicon nitride film is removed at the pattern to obtain an adequate gate silicon nitride critical dimension, reduce dishing, and reduce erosion of polysilicon and BPSG.

Using a direct chemical mechanical polishing process, doped polysilicon is polished first, then the BPSG layer and landed polysilicon are polished, next some landed polysilicon contact pattern on the gate silicon nitride, landed polysilicon, and BPSG between gate are removed. The process then removes a little gate silicon nitride at the pattern to obtain an adequate gate silicon nitride critical dimension, reduce dishing and erosion of polysilicon and BPSG.

Landed polysilicon contact is often a critical process for 0.13 um DRAM and next generation DRAM, but it needs to keep good top gate AEI critical dimension uniformity, lower dishing and erosion at landed polysilicon contact poly CMP step, which is difficult using conventional polysilicon slurry. The present invention has a method that uses oxide slurry to polish polysilicon, BPSG and silicon nitride at the same time, make landed polysilicon contact work and get high throughput. In addition, etch back and no etch back processes are included depending upon the embodiment.

Figure 3:
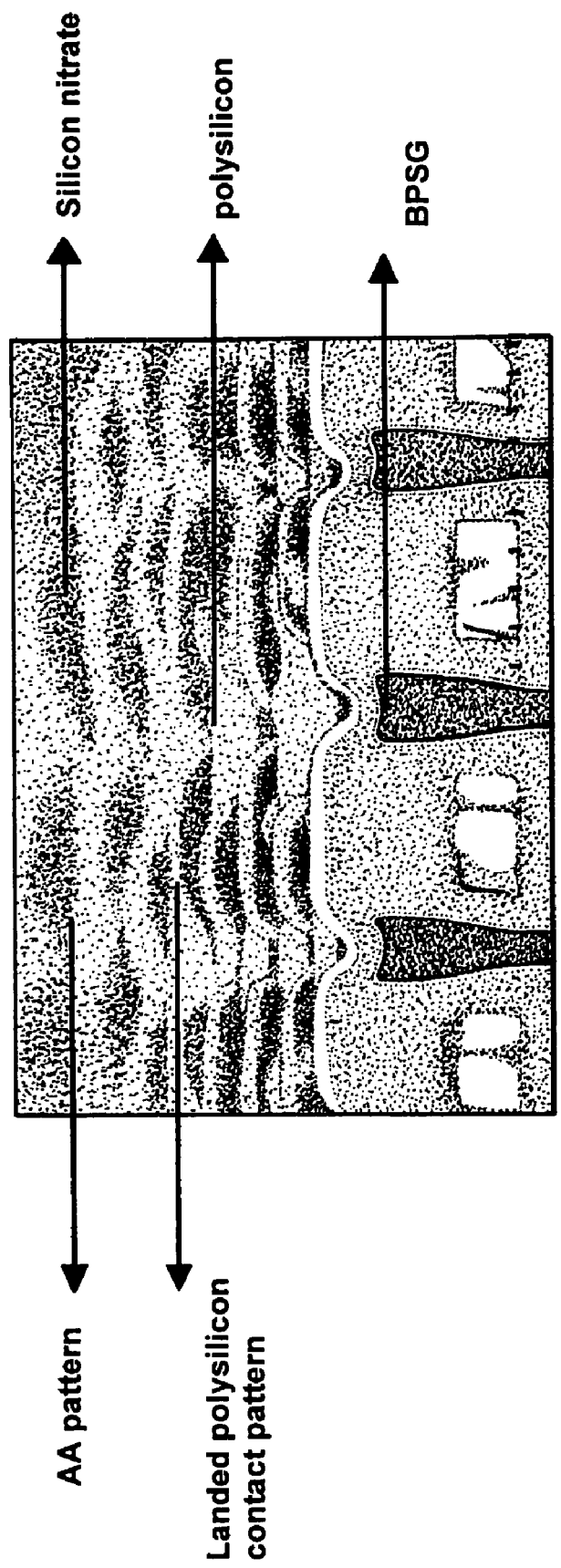
FIG. 3 is a tilt angle of cross sectional view of scanning electron micrograph(SEM) after landed polysilicon contact chemical mechanical polishing according to an embodiment of the present invention.

FIG. 3 is a simplified diagram of tilt angle of cross section scanning electron micrograph(SEM) after landed polysilicon contact chemical mechanical polishing according to an embodiment of the present invention. This diagram is merely an example, which should not unduly limit the scope of the claims herein. One of ordinary skill in the art would recognize many variations, modifications, and alternatives.

Figure 4:
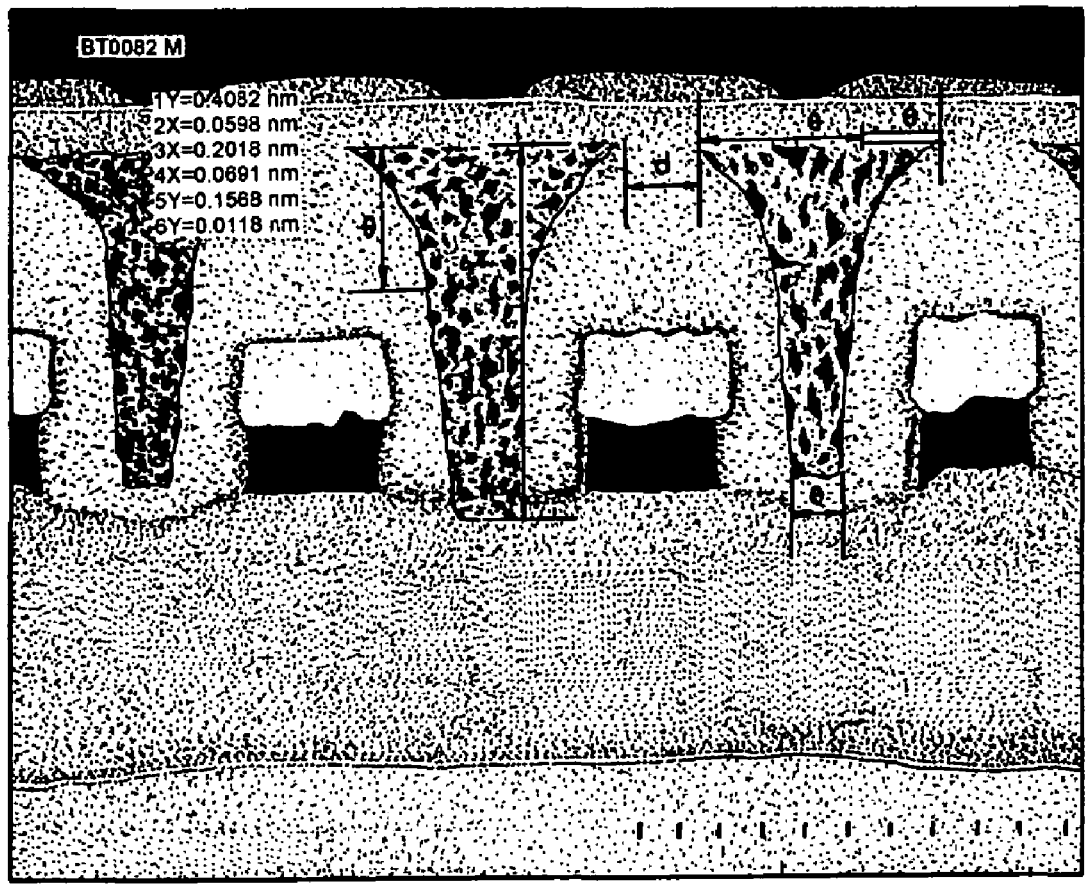
FIG. 4 is a cross sectional SEM of active area after landed polysilicon contact chemical mechanical polishing according to an embodiment of the present invention.

FIG. 4 is a simplified cross section SEM of the pattern after landed polysilicon contact chemical mechanical polishing according to an embodiment of the present invention. This diagram is merely an example, which should not unduly limit the scope of the claims herein. One of ordinary skill in the art would recognize many variations, modifications, and alternatives. As shown, the diagram reveals that the dishing and erosion are very small and that dishing is about 100~400 A, which is desirable.

Figure 5:
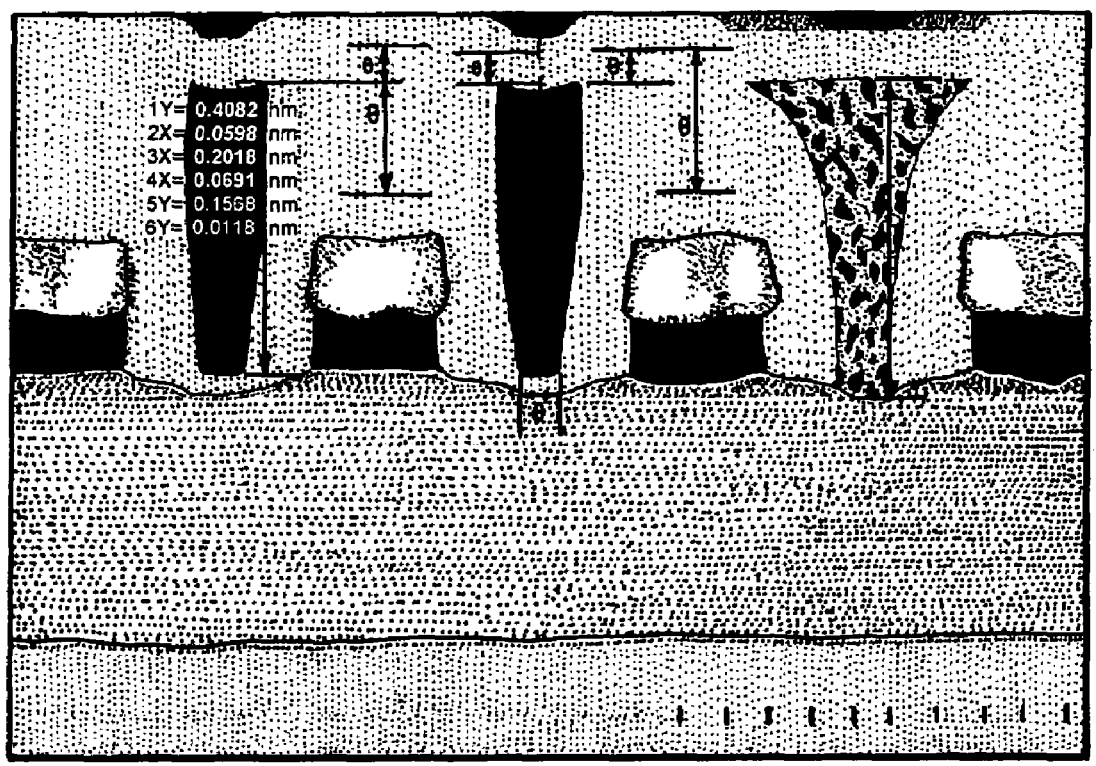
FIG. 5 is a cross sectional SEM of landed polysilicon contact pattern after landed polysilicon contact chemical mechanical polishing according to an embodiment of the present invention.

FIG. 5 is a simplified cross section SEM of landed polysilicon contact pattern after landed polysilicon contact chemical mechanical polishing according to an embodiment of the present invention. This diagram is merely an example, which should not unduly limit the scope of the claims herein. One of ordinary skill in the art would recognize many variations, modifications, and alternatives. As shown, the diagram reveals that the dishing and erosion are smaller, but they are bigger than the active area. The AA pattern is based upon the higher silicon nitride removal amount at landed polysilicon contact pattern than active area. The poly dishing about 200~400 and BPSG dishing about 300~600 Å.

Figure 6:
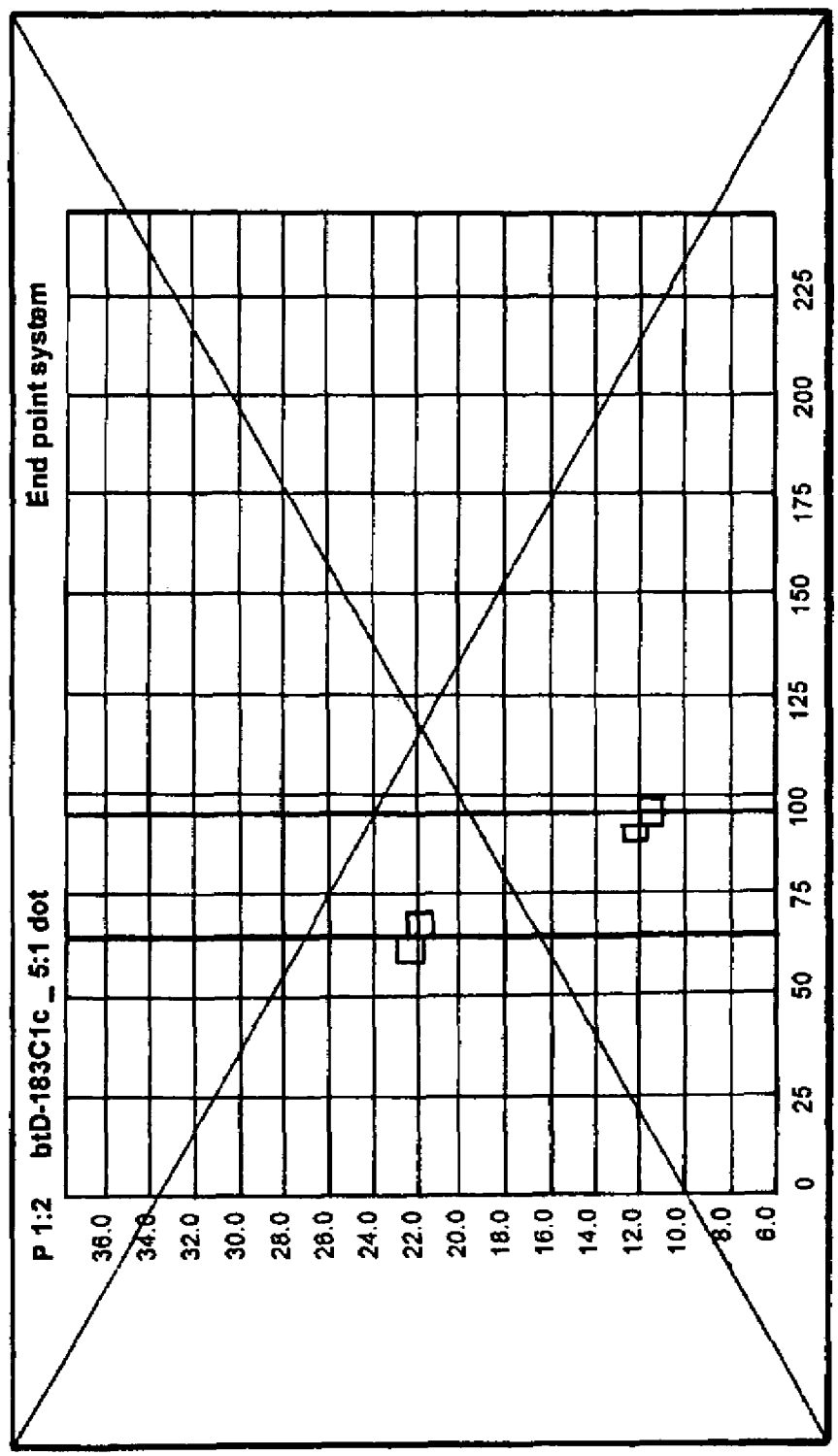
FIG. 6 is a graph of an end point curve, which use optical end point system, according to an embodiment of the present invention.

FIG. 6 is a simplified end point curve, which use optical end point system, according to an embodiment of the present invention. This diagram is merely an example, which should not unduly limit the scope of the claims herein. One of ordinary skill in the art would recognize many variations, modifications, and alternatives. The data reveal optical endpoints can work in a desirable manner. Depending upon the embodiment, there can be other details regarding the present invention.

In a preferred embodiment, the invention provides a method for landed polysilicon contact chemical mechanical polishing. This method includes forming a gate including thicker silicon nitride deposition; forming landed polysilicon contact pattern after landed polysilicon contact photo and etch; depositing doped polysilicon to form landed polysilicon contact; controlling gate silicon nitride critical dimension and keeping lower dishing and erosion of landed polysilicon plug and BPSG using chemical mechanical polishing. Preferably, the method uses oxide slurry instead of polysilicon slurry to polish, polysilicon, BPSG, and silicon nitride. Additionally, the method uses a slurry called Cabot Microelectronics SS-25 or other suitable mixtures as the oxide slurry and any dilution of all or certain kinds of oxide slurry. Preferably, the gate silicon nitride has a thickness of 200 Angstroms 800 Angstroms greater than before. Optionally, the method can also include an etch back process depending upon the specific embodiment.

Preferably, the method includes a same or similar removal rate between polysilicon and BPSG and lower removal rate of silicon nitride film, which is used as the polish stop layer. The removal rate of polysilicon and BPSG is about 1200 Å/minute to 5000 Å/minute, and silicon nitride removal rate is about 120 Å/minute to 800 Å/minute, depending upon the embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated circuit device, the method comprising:

providing a semiconductor substrate;

forming a plurality of MOS transistor devices overlying the semiconductor substrate, each of the MOS transistor devices having a nitride cap and nitride sidewall spacers, each of the transistors being separated from each other by a predetermined width;

forming an interlayer dielectric layer overlying the plurality of MOS transistor devices;

removing a portion of the interlayer dielectric material overlying three MOS transistor devices to expose at least portions of the three MOS transistor devices and to expose at least three regions between respective MOS transistor devices;

depositing polysilicon fill material overlying the exposed three regions and overlying the three MOS transistor devices;

without etching back the polysilicon material, performing a chemical mechanical planarization process on the polysilicon material to reduce a thickness of the polysilicon material to expose a portion of the interlayer dielectric material;

continuing the chemical mechanical planarization process to remove the interlayer dielectric material and the polysilicon film material until the cap nitride layer on each of the MOS transistors has been exposed; and using the cap nitride overlying each of the MOS transistors as a polish stop layer.

2. The method of claim 1 wherein the interlayer dielectric layer is BPSG.

3. The method of claim 1 wherein the polysilicon fill material is in-situ doped and deposited in an amorphous state.

4. The method of claim 1 wherein the chemical mechanical planarization process comprises a slurry with a selectivity of about 1:1 for the interlayer dielectric:polysilicon.

5. The method of claim 1 wherein the chemical mechanical planarization process is Cabot Microelectronics SS-25™.

6. The method of claim 1 wherein the chemical mechanical planarization process is characterized by a selectivity of at least 3:1 for polysilicon:nitride cap, with >8:1 preferred.

7. The method of claim 1 wherein the three MOS devices are provided in a cell region.

8. The method of claim 1 further comprising detecting an end point of the chemical mechanical planarization process.

9. The method of claim 1 wherein the cap nitride is polished for about 200 A or less.

10. The method of claim 1 wherein the polysilicon fill material forms a plug structure between each of the MOS transistor devices, the plug structure having a width of 0.06 to 0.15 microns.

11. The method of claim 1 further comprising removing a portion of the polysilicon fill material using an etch back process before chemical mechanical planarization.

12. A method for fabricating an integrated circuit device, the method comprising:

providing a semiconductor substrate;

forming a plurality of MOS transistor devices overlying the semiconductor substrate, each of the MOS transistor devices having a nitride cap and nitride sidewall spacers, each of the transistors being separated from each other by a predetermined width;

forming an interlayer dielectric layer overlying the plurality of MOS transistor devices;

removing a portion of the interlayer dielectric material overlying three MOS transistor devices to expose at least portions of the three MOS transistor devices and to expose at least three regions between respective MOS transistor devices;

depositing polysilicon fill material overlying the exposed three regions and overlying the three MOS transistor devices;

without etching back the polysilicon material, using an oxide slurry mixture, performing a chemical mechanical planarization process on the polysilicon material to reduce a thickness of the polysilicon material to expose a portion of the interlayer dielectric material;

continuing the chemical mechanical planarization process to remove the interlayer dielectric material and the polysilicon film material until the cap nitride layer on each of the MOS transistors has been exposed; and using the cap nitride layer overlying each of the MOS transistors as a polish stop layer.

13. The method of claim 12 wherein the chemical mechanical polishing process occurs at 44 RPM and downforce of 3 psi.

14. The method of claim 12 wherein the interlayer dielectric material comprises BPSG.

15. The method of claim 12 wherein a portion of the interlayer dielectric material and a portion of the polysilicon material are simultaneously removed using the chemical mechanical planarization process.

16. The method of claim 12 wherein the chemical mechanical planarization process further removes a portion of the interlayer dielectric material in a peripheral region until one or more of the cap nitride layer(s) on respective MOS transistors has been exposed.

17. A method for fabricating an integrated circuit device, the method comprising:

providing a semiconductor substrate;

forming a plurality of MOS transistor devices overlying the semiconductor substrate, each of the MOS transistor devices having a nitride cap and nitride sidewall spacers, each of the transistors being separated from each other by a predetermined width;

forming an interlayer dielectric layer overlying the plurality of MOS transistor devices;

removing a portion of the interlayer dielectric material overlying three MOS transistor devices to expose at least portions of the three MOS transistor devices and iq expose at least three regions between respective MOS transistor devices;

depositing polysilicon fill material overlying the exposed three regions and overlying the three MOS transistor devices;

without etching back the polysilicon material, using an oxide slurry mixture, performing a chemical mechanical planarization process on the polysilicon material to reduce a thickness of the polysilicon fill material to expose a portion of the interlayer dielectric material;

continuing the chemical mechanical planarization process;

simultaneously removing the interlayer dielectric material and the polysilicon fill material using the oxide slurry mixture while performing the chemical mechanical planarization process until the cap nitride layer on each of the MOS transistors has been exposed;

using the cap nitride layer overlying each of the MOS transistors as a polish stop layer while simultaneously removing the interlayer dielectric material and the polysilicon fill material; and polishing a portion of the cap nitride layer overlying each of the MOS transistors to pattern each of the MOS transistors;

whereupon the polishing the portion of the cap nitride layer is provided to achieve a predetermined critical dimension of each of the MOS transistors.

18. The method of claim 17 wherein the interlayer dielectric layer is BPSG.

19. The method of claim 17 wherein the MOS transistors are for DRAM cells.

20. The method of claim 17 further comprising an etch back process on the polysilicon fill material.

* * * * *